United States Patent
Yoon et al.

(10) Patent No.: US 7,958,433 B1
(45) Date of Patent: Jun. 7, 2011

(54) METHODS AND SYSTEMS FOR STORING DATA IN MEMORY USING ZONING

(75) Inventors: Tony Yoon, San Jose, CA (US); Pantas Sutardja, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 463 days.

(21) Appl. No.: 11/947,581

(22) Filed: Nov. 29, 2007

Related U.S. Application Data

(60) Provisional application No. 60/867,973, filed on Nov. 30, 2006.

(51) Int. Cl.
*H03M 13/00* (2006.01)
(52) U.S. Cl. .......................................... 714/774; 711/173
(58) Field of Classification Search ................ 714/1–57, 714/701–702, 710–711, 718–723
See application file for complete search history.

(56) References Cited

U.S. PATENT DOCUMENTS

| | | | | |
|---|---|---|---|---|
| 5,758,050 | A | * | 5/1998 | Brady et al. ...................... 714/1 |
| 7,533,330 | B2 | * | 5/2009 | Anderson et al. ............. 714/799 |

* cited by examiner

*Primary Examiner* — Robert Beausoliel
*Assistant Examiner* — Steve Nguyen

(57) ABSTRACT

Methods and systems for storing data in a memory system with different levels of redundancy are disclosed. Methods and systems consistent with the present invention provide allow a redundancy level to be associated with received data, wherein associating the redundancy level of the data includes determining a desired level of protection for that data and determining the redundancy level based on the desired level of protection. A zone within a memory system is located that has a redundancy level that matches the redundancy level of the data, and the data is stored in the located zone with the desired redundancy level.

35 Claims, 2 Drawing Sheets

METHODS AND SYSTEMS FOR STORING DATA IN MEMORY USING ZONING

RELATED APPLICATIONS

The present application claims priority under 35 U.S.C. §119(e) from provisional application Ser. No. 60/867,973, filed on Nov. 30, 2006, the contents of which are incorporated by reference in their entirety.

FIELD OF DISCLOSURE

The present disclosure relates generally to the storage of data in a memory system and, more particularly, to storing data in zones of a memory with different zone redundancy levels.

BACKGROUND

Memory systems typically store data with some level of redundancy. Redundancy helps protect the integrity of data by providing a means for verifying data in the event of a problem during storage or if data becomes corrupted while being stored. Memory systems employ error correction codes (ECC) offering varying levels of protection for data. In general, data stored with a higher level of redundancy means that a larger set of redundancy data is stored and the data is afforded a higher level of protection. Increasing redundancy acts to protect the data by increasing the probability that corrupted data will be backed up with uncorrupted, redundantly stored data.

However, while data reliability may be increased by maximizing the amount of redundancy data stored in memory, this policy has drawbacks. For example, increased redundancy results in a need for more storage space and consequently higher storage costs. Higher redundancy means that less of the memory is available for use by the system, as half or more of the memory must be reserved for redundant storage.

Conventional memory systems store data with a uniform level of redundancy. These systems are inefficient because all data may not need the same level of protection. However, very often all data is stored at a high level of redundancy to reduce the risk that the small amount of very important data may be lost. What is needed is a method and a system for storing data in a memory system with different levels of redundancy.

SUMMARY

Consistent with principles of the invention, methods, systems, and apparatuses for storing data are presented. Data is associated with a data redundancy level. A zone within a memory system with a zone redundancy level that matches the redundancy level of the data is located, the memory being partitioned into a plurality of zones with each of the plurality of zones associated with a respective redundancy level. The data is then stored in the located zone.

Additionally or alternatively, in certain methods, systems and apparatuses for storing data, data is received from a computer system. A data redundancy level is associated to the received data, wherein associating the data redundancy level to the data includes determining a desired level of protection for that data and determining the data redundancy level based on the desired level of protection. A zone within a memory system with a zone redundancy level that matches the redundancy level of the data is located, the memory being partitioned into a plurality of zones with each of the plurality of zones associated with a zone redundancy level. The data stored in the located zone.

Further memory systems for storing data are also presented that include a memory that is partitioned into a plurality of zones, each of the plurality of zones associated with a redundancy level, and a memory controller. The memory controller associates a data redundancy level with the data, locates a zone within a memory system with a zone redundancy level that matches the data redundancy level of the data, the memory being partitioned into a plurality of zones with each of the plurality of zones associated with a respective zone redundancy level, and stores the data in the located zone.

Still further memory systems for storing data are presented which include a memory partitioned into a plurality of zones, each of the plurality of zones associated with a redundancy level, and a memory controller. The memory controller determines a data redundancy level associated with received data, the data redundancy level of the data representing a desired level of protection for the data, locates a zone within the memory with a data redundancy level that matches the data redundancy level of the data, and stores the data in the located zone.

Additionally or alternatively, systems for storing data are presented which include means for associating a data redundancy level with the data, means for locating a zone within a memory system with a zone redundancy level that matches the data redundancy level of the data, the memory being partitioned into a plurality of zones with each of the plurality of zones associated with a respective zone redundancy level, and means for storing the data in the located zone.

DESCRIPTION OF THE EMBODIMENTS

Reference will now be made in detail to embodiments of the present invention, examples of which are illustrated in the accompanying drawings. Wherever possible, the same reference numbers will be used throughout the drawings to refer to the same or like parts.

In computer systems, it is frequently the case that not all data stored in memory is of equal importance such that it needs to be maintained with the same level of reliability or redundancy. Data of greater importance may be stored with a greater data redundancy level than data of lesser importance. Using a personal computer as an example, it is likely more important to the user that software programs, look-up tables, or other core programs not be corrupted as this would disturb operation of the computer. Furthermore, a user might not want to store other, less important, data with the same level of redundancy as the core programs. However, in conventional memory systems, data is stored with a uniform level of redundancy making it difficult to balance the level of protection with cost and other concerns.

Figure 1:
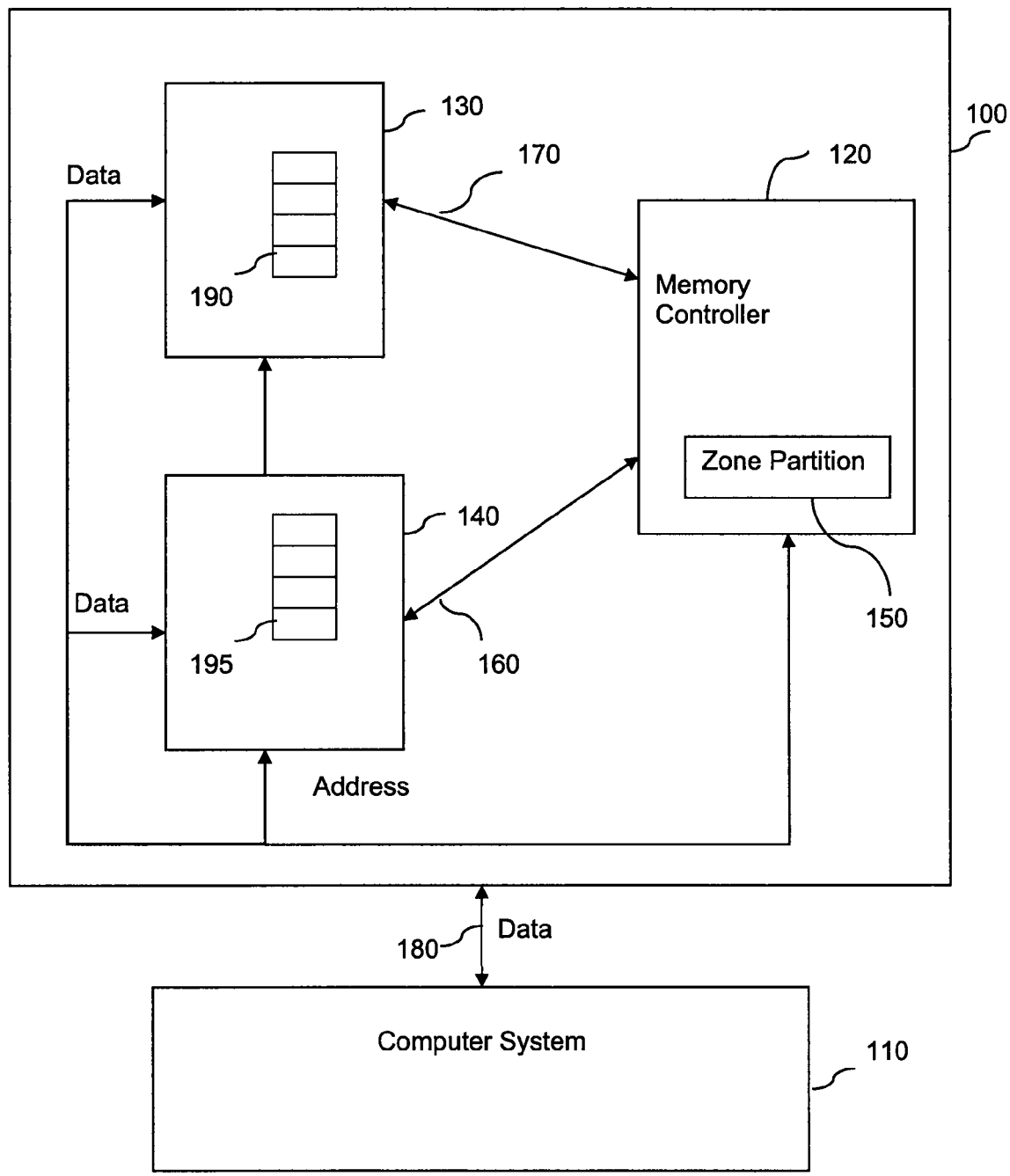
FIG. 1 shows a diagram of a memory storage device using zones for storing data with varying levels of redundancy, consistent with some embodiments of the present invention.

FIG. 1 shows a diagram of a memory storage device using zones for storing data with varying levels of redundancy, consistent with some embodiments of the present invention. FIG. 1 shows a memory system 100, a computer system 110, a memory controller 120, a zone 130, a zone 140, a zone partitioning system 150, interface busses 160, 170 and 180, a storage array 190, and a storage array 195. Memory system 100 may be, for example, a solid state memory system, a redundant array of independent disks (RAID), or a flash memory. For purposes of this disclosure, a "disk" is any non-volatile, randomly accessible, rewritable mass storage device that has the ability to detect its own storage failures. Examples of a disk may include rotating magnetic and optical disks, solid-state disks, and non-volatile electronic storage elements (such as PROMs, EPROMs, and EEPROMs). The term "disk array" means a collection of disks, the hardware (such as a controller) required to connect them to one or more host computers, and management software used to control the operation of the physical disks and present them as one, or more virtual disks to the host operating environment. A "virtual disk" is an abstract entity realized in the disk array by the management software.

Memory system 100 may be coupled to computer system 110 via interface bus 180. Computer system 110 may send data to memory system 100, and may also receive data from memory system 100. A data redundancy level may be associated with the data. Memory system 100 may be partitioned into two or more zones 130 and 140. In at least one embodiment, the configuration of memory partitioning into zones 130 and 140 is established during system setup.

Memory controller 120 may be coupled to zones 130 or 140 via one or more interface buses 160 and 170, such as a small computer system interface (SCSI). Zone partitioning system 150 may be embodied as a separate component of memory system 100, configured within memory controller 120, or configured within computer system 110 to provide a means for controlling memory storage and zone redundancy levels, and for transferring data among various zone redundancy levels. Once memory system 100 is partitioned into zones A and B 130 and 140 data may be stored in one or more zones 130 and 140.

A zone redundancy level may be associated with one or more of zones 130 and 140. In some embodiments, all zones of memory system 100 are associated with a zone redundancy level. Zone redundancy levels may include mirror or parity zone redundancy levels, or may be set to zero. The zone redundancy level of, for example, zone 130 may be greater than the zone redundancy level of, for example, zone 140. A zone or zones 130 and/or 140 may be associated with a default zone redundancy level, for example, zero, or one. A zone with a greater zone redundancy level may provide improved protection for the data it stores.

The zone redundancy level of a zone, for example zone 130 or 140, may determine the level of redundancy with which data is stored in zone 130 or 140. A zone 130 or 140 with a greater zone redundancy level may store more redundancy data than a zone 130 or 140 with a lower zone redundancy level. For example, if the zone redundancy level of zone 130 is four then four times as much redundancy data may be stored in zone 130. Likewise, if the zone redundancy level for zone 130 is two, then two times as much redundancy data may be stored.

Memory controller 120 may be coupled to storage arrays 190 and 195 of zones 130 and 140 respectively via one or more interface buses 160 and 170, such as a small computer system interface (SCSI). Storage array 190 and/or 195 may be associated with a zone redundancy level and may include a RAID.

Figure 2:
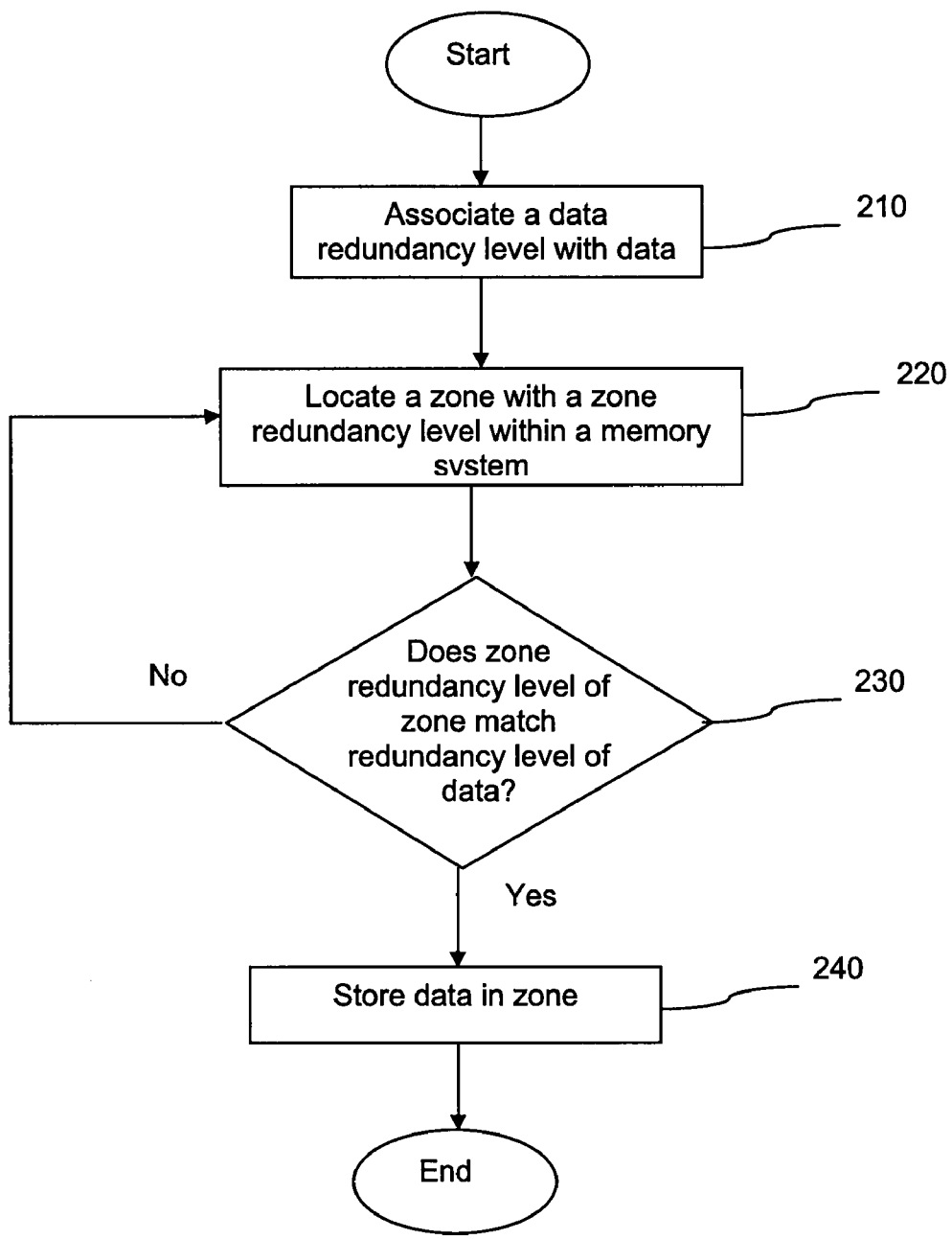
FIG. 2 is a flow chart showing an exemplary process for redundantly storing data in a memory device using zones, consistent with some embodiments of the present invention.

FIG. 2 is a flow chart showing an exemplary process 200 for storing data in a memory device with varying levels of redundancy using zones, consistent with some embodiments of the present invention. In step 210, a data redundancy level is associated with data. Data may be assigned a data redundancy level by, for example, a user, a host, or a memory controller. A data redundancy level assigned to the data may also be programmable. For example, a user may be allowed to specify a data redundancy level for various types of data. Typically a user will choose a higher level of redundancy for more important data. In another example, a host or memory controller specifies a protection level of various types of data.

In at least one embodiment, the data redundancy level associated with data is based on the desired amount of protection for the data. Data redundancy level for data may also be assigned based on the type of data. If the data type is available, the data may be assigned a data redundancy level based on the data redundancy level assigned for that particular type. In other words, the type of the data may be determined, and a data redundancy level may be associated with the data based on its determined type. For example, a high data redundancy level may be associated with software programs, or operating system data for a personal computer, while a low data redundancy level may be associated with music files stored on the computer.

In step 220, a zone with a zone redundancy level is located within a memory system. The zone may be located by a memory controller and may be associated with a zone redundancy level. In step 230, it is determined whether the zone redundancy level of the located zone matches the zone redundancy level associated with the data. If the zone redundancy level of the located zone matches the zone redundancy level of the data, it may be stored in the located zone (step 240) and the process may end. If the zone redundancy level of the located zone does not match the zone redundancy level associated with the data, it may not be stored in the located zone. Data may be stored so that the storage space of the memory system is maximized. Maximizing the storage space of the memory system may include associating a data redundancy level with the data by determining a minimum level of protection for the data and associating the data with a data redundancy level based on the minimum level of protection.

In one embodiment, the data redundancy level of the stored data may change, over time, based on one or more criteria. The data may then be moved from one zone of the memory system to another zone of the memory system based on its changed data redundancy level. Exemplary criteria may include a desired level of protection for the data, the length of time the data is stored in the memory system, or the type of data. For example, a user may set the criteria of decreasing the data redundancy level of tax information after seven years.

In at least one embodiment, the zones of the memory system may be balanced so that data is appropriately stored in its respective zone. The balancing of zones may be user programmable or may be automatically implemented according to one or more criteria. For example, if stored data becomes more valuable with time it may be moved from a zone with a low zone redundancy level to a zone with a high zone redundancy level as time passes. Additionally or alternatively, the data redundancy level of the stored data may be gradually increased or decreased over time. Stored data may be moved from one zone to another as the data redundancy level increases or decreases. In one embodiment, zones of the memory system may be balanced to maximize storage space of the memory system.

The systems and methods disclosed herein are not inherently related to any particular computer or other apparatus, and may be implemented by a suitable combination of hardware, software, and/or firmware. Software implementations may include one or more computer programs. A computer program is a set of instructions readable and executable by a processor and can be written in any form of programming language, including compiled or interpreted languages, and it can be deployed in any form, including as a stand alone program or as a module, component, subroutine, or other unit suitable for use in a computing environment. A computer program can be deployed to be executed on one computer or on multiple computers at one site or distributed across multiple sites and interconnected by a communication network. Software may also be implemented as a computer program product, i.e., one or more computer programs tangibly embodied in an information carrier, e.g., in a machine readable storage device or in a propagated signal, for execution by, or to control the operation of, data processing apparatus, e.g., a programmable processor, a computer, or multiple computers.

It will be apparent to those skilled in the art that various modifications and variations can be made in the methods of the present invention and in construction of this circuit without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of storing data, the method comprising:
    associating a data redundancy level with the data, wherein the data redundancy level corresponds to a desired level of protection for the data;
    locating, based on the desired level of protection for the data, a zone within a memory system having a zone redundancy level that matches the data redundancy level of the data, the memory system having been previously partitioned into a plurality of zones with each of the plurality of zones associated with a respective zone redundancy level;
    storing the data in the located; and
    in response to a change in the data redundancy level associated with the data stored in the located zone, moving the data to another zone within the memory system,
    wherein the change in the data redundancy level associated with the data stored in the located zone is based on at least one criterion, the at least one criterion including a length of time that the data is stored in the memory system.

2. The method of claim 1, wherein the memory system is a solid state memory system.

3. The method of claim 1, wherein a first zone of the plurality of zones has a greater zone redundancy level than a second zone of the plurality of zones.

4. The method of claim 1, wherein associating the data redundancy level of the data includes determining the desired level of protection for that data and determining the data redundancy level based on the desired level of protection.

5. The method of claim 1, wherein:
    associating a data redundancy level with the data further comprises:
        determining a minimum level of protection for the data, and
        associating the data with a data redundancy level based on the determined minimum level of protection; and
    storing the data in the located zone comprises storing only data required to meet the minimum level of protection for the data so that storage space of the memory system is maximized.

6. The method of claim 1, wherein the at least one criterion further includes at least one of a desired level of protection for the data, or a type of data.

7. The method of claim 1, wherein the memory system is a flash memory or a solid disk array having a plurality of disks.

8. The method of claim 7, wherein the solid disk array is a non-volatile, randomly accessible, rewriteable mass storage device.

9. The method of claim 7, wherein the solid disk array includes at least one of the following: rotating magnetic disks, optical disks, solid state disks, non-volatile electronic storage elements, or a redundant array of independent disks (RAID).

10. A method for storing data, the method comprising:
    receiving data from a computer system;
    associating a data redundancy level to the received data, wherein associating the data redundancy level to the data includes determining a desired level of protection for that data and determining the data redundancy level based on the desired level of protection;
    locating, based on the desired level of protection, a zone within a memory system with a zone redundancy level that matches the data redundancy level of the data, the memory being partitioned into a plurality of zones with each of the plurality of zones associated with a zone redundancy level;
    storing the data in the located zone; and
    in response to a change in the data redundancy level associated with the data stored in the located zone, moving the data to another zone within the memory system,
    wherein the change in the data redundancy level associated with the data stored in the located zone is based on at least one criterion, the at least one criterion including a length of time that the data is stored in the memory system.

11. The method of claim 10, wherein the memory system is a solid state memory system.

12. The method of claim 10, wherein a first zone of the plurality of zones has a greater redundancy level than a second zone of the plurality of zones.

13. The method of claim 10, wherein:
    associating a data redundancy level with the data further comprises
        determining a minimum level of protection for the data, and
        associating the data with a data redundancy level based on the determined minimum level of protection; and
    storing the data in the located zone comprises storing only data required to meet the minimum level of protection for the data so that storage space of the memory system is maximized.

14. The method of claim 10, wherein the at least one criterion further includes at least one of a desired level of protection for the data, or a type of data.

15. The method of claim 10, wherein the memory system is a flash memory or a solid disk array having a plurality of disks.

16. The method of claim 15, wherein the solid disk array is a non-volatile, randomly accessible, rewriteable mass storage device.

17. The method of claim 15, wherein the solid disk array includes at least one of the following: rotating magnetic disks, optical disks, solid state disks, non-volatile electronic storage elements, or a redundant array of independent disks (RAID).

18. A memory system for storing data, the memory system comprising:
- a memory partitioned into a plurality of zones, each of the plurality of zones associated with a redundancy level; and
- a memory controller for
  - associating a data redundancy level with the data;
  - locating, based on a desired level of protection, a zone within a memory system with a zone redundancy level that matches the data redundancy level of the data, the memory being partitioned into a plurality of zones with each of the plurality of zones associated with a respective zone redundancy level;
  - storing the data in the located zone; and
  - in response to a change in the data redundancy level associated with the data stored in the located zone, moving the data to another zone within the memory system,
  - wherein the change in the data redundancy level associated with the data stored in the located zone is based on at least one criterion, the at least one criterion including a length of time that the data is stored in the memory system.

19. The memory system of claim 18, wherein the memory system is a solid state memory system.

20. The memory system of claim 18, wherein a first zone of the plurality of zones has a greater zone redundancy level than a second zone of the plurality of zones.

21. The memory system of claim 18, wherein associating the data redundancy level of the data includes determining the desired level of protection for that data and determining the data redundancy level based on the desired level of protection.

22. The memory system of claim 18, wherein:
- associating a data redundancy level with the data further comprises
  - determining a minimum level of protection for the data, and
  - associating the data with a data redundancy level based on the determined minimum level of protection; and
- storing the data in the located zone comprises storing only data required to meet the minimum level of protection for the data so that storage space of the memory system is maximized.

23. The memory system of claim 18, wherein the at least one criterion further includes at least one of a desired level of protection for the data or a type of data.

24. The memory system of claim 18, wherein the memory system is a flash memory or a solid disk array having a plurality of disks.

25. The memory system of claim 24, wherein the solid disk array is a non-volatile, randomly accessible, rewriteable mass storage device.

26. The memory system of claim 24, wherein the solid disk array includes at least one of the following: rotating magnetic disks, optical disks, solid state disks, non-volatile electronic storage elements, or a redundant array of independent disks (RAID).

27. A memory system comprising:
- a memory partitioned into a plurality of zones, each of the plurality of zones associated with a redundancy level; and
- a memory controller for
  - determining a data redundancy level associated with received data, the data redundancy level of the data representing a desired level of protection for the data;
  - locating, based on the desired level of protection, a zone within the memory with a zone redundancy level that matches the data redundancy level of the data,
  - storing the data in the located zone; and
  - in response to a change in the data redundancy level associated with the data stored in the located zone, moving the data to another zone within the memory system,
  - wherein the change in the data redundancy level associated with the data stored in the located zone is based on at least one criterion, the at least one criterion including a length of time that the data is stored in the memory system.

28. The memory system of claim 27, wherein the memory system is a solid state memory system.

29. The memory system of claim 27, wherein a first zone of the plurality of zones has a greater zone redundancy level than a second zone of the plurality of zones.

30. The memory system of claim 27, wherein associating the data redundancy level of the data includes determining a desired level of protection for that data and determining the data redundancy level based on the desired level of protection.

31. The memory system of claim 27, wherein:
- associating a data redundancy level with the data further comprises
  - determining a minimum level of protection for the data, and
  - associating the data with a data redundancy level based on the determined minimum level of protection; and
- storing the data in the located zone comprises storing only data required to meet the minimum level of protection for the data so that storage space of the memory system is maximized.

32. The memory system of claim 27, wherein the at least one criterion further includes at least one of a desired level of protection for the data, or a type of data.

33. The memory system of claim 27, wherein the memory system is a flash memory or a solid disk array having a plurality of disks.

34. The memory system of claim 33, wherein the solid disk array is a non-volatile, randomly accessible, rewriteable mass storage device.

35. The memory system of claim 33, wherein the solid disk array includes at least one of the following: rotating magnetic disks, optical disks, solid state disks, non-volatile electronic storage elements, or a redundant array of independent disks (RAID).

* * * * *

UNITED STATES PATENT AND TRADEMARK OFFICE
CERTIFICATE OF CORRECTION

| | | |
|---|---|---|
| PATENT NO. | : 7,958,433 B1 | Page 1 of 1 |
| APPLICATION NO. | : 11/947581 | |
| DATED | : June 7, 2011 | |
| INVENTOR(S) | : Yoon et al. | |

It is certified that error appears in the above-identified patent and that said Letters Patent is hereby corrected as shown below:

In the Claims

Column 5, line 39, Claim 1 change "storing the data in the located; and" to --storing the data in the located zone; and--

Signed and Sealed this
Sixth Day of August, 2013

Teresa Stanek Rea
*Acting Director of the United States Patent and Trademark Office*